(12) United States Patent
Yang et al.

(10) Patent No.: US 10,020,437 B2
(45) Date of Patent: Jul. 10, 2018

(54) SUPERCONDUCTIVE CURRENT LIMITING ELEMENT OF CURRENT LIMITER AND METHOD FOR MANUFACTURING SUPERCONDUCTIVE CURRENT LIMITING ELEMENT OF CURRENT LIMITER

(71) Applicant: Korea Electric Power Corporation, Seoul (KR)

(72) Inventors: Seong-Eun Yang, Daejeon (KR); Hye-Rim Kim, Daejeon (KR); Woo-Seok Kim, Seoul (KR); Seung-Duck Yu, Daejeon (KR); Hee-Sun Kim, Daejeon (KR); Ji-Young Lee, Daejeon (KR); Byung-Jun Park, Daejeon (KR); Young-Hee Han, Daejeon (KR); Sang-Jin Han, Daejeon (KR)

(73) Assignee: Korea Electric Power Corporation, Seoul (KR)

( * ) Notice: Subject to any disclaimer, the term of this patent is extended or adjusted under 35 U.S.C. 154(b) by 86 days.

(21) Appl. No.: 14/888,364

(22) PCT Filed: Jul. 18, 2014

(86) PCT No.: PCT/KR2014/006539
§ 371 (c)(1),
(2) Date: Oct. 30, 2015

(87) PCT Pub. No.: WO2015/046727
PCT Pub. Date: Apr. 2, 2015

(65) Prior Publication Data
US 2016/0087427 A1    Mar. 24, 2016

(30) Foreign Application Priority Data
Sep. 30, 2013  (KR) ........................ 10-2013-0116740

(51) Int. Cl.
*H01L 39/12*    (2006.01)
*H01L 39/16*    (2006.01)
(Continued)

(52) U.S. Cl.
CPC ........... *H01L 39/128* (2013.01); *H01B 12/02* (2013.01); *H01L 39/16* (2013.01); *H02H 9/023* (2013.01); *Y10S 505/703* (2013.01)

(58) Field of Classification Search
CPC ............. Y10S 505/703; Y10S 505/704; Y10S 505/705; Y10S 505/706; H01L 39/128
See application file for complete search history.

(56) References Cited

FOREIGN PATENT DOCUMENTS

| JP | 07-143668 A | 6/1995 |
|---|---|---|
| JP | 10-094166 A | 4/1998 |

(Continued)

OTHER PUBLICATIONS

Toshiba Corp, Machine Translation of JP 07-143668A, Jun. 2, 1995.*

(Continued)

*Primary Examiner* — Jeremy C Norris
(74) *Attorney, Agent, or Firm* — McDermott Will & Emery LLP

(57) ABSTRACT

Disclosed are a superconducting current-limiting element for a current limiter and a method of manufacturing a superconducting current-limiting element for a current limiter, in which the current-limiting element is formed in series by stacking linear superconducting wires, or is formed in parallel by stacking superconducting wires so that one or more superconducting wires are disposed in the same layer, thus facilitating the formation of the current-limiting element in series or in parallel and obviating the use of a winding machine when manufacturing the current-limiting element.

12 Claims, 24 Drawing Sheets

(51) Int. Cl.
*H01B 12/02* (2006.01)
*H02H 9/02* (2006.01)

(56) References Cited

FOREIGN PATENT DOCUMENTS

| | | |
|---|---|---|
| JP | H04-003477 A | 2/2017 |
| KR | 10-2007-0068929 A | 7/2007 |
| KR | 10-2009-0128503 A | 12/2009 |
| KR | 10-2010-0136300 A | 12/2010 |
| WO | 2012/091941 A1 | 7/2012 |

OTHER PUBLICATIONS

International Search Report issued in International Application No. PCT/KR2014/006539 dated Sep. 23, 2014, with English translation.

\* cited by examiner

SUPERCONDUCTIVE CURRENT LIMITING ELEMENT OF CURRENT LIMITER AND METHOD FOR MANUFACTURING SUPERCONDUCTIVE CURRENT LIMITING ELEMENT OF CURRENT LIMITER

RELATED APPLICATIONS

This application is the U.S. National Phase under 35 U.S.C. § 371 of International Application No. PCT/KR2014/006539, filed on Jul. 18, 2014, which in turn claims the benefit of Korean Application No. 10-2013-0116740, filed on Sep. 30, 2013, the disclosures of which are incorporated by reference herein.

TECHNICAL FIELD

The present invention relates to a superconducting current-limiting element for a current limiter and a method of manufacturing the superconducting current-limiting element for a current limiter, in which the current-limiting element is formed in series by stacking linear superconducting wires, or is formed in parallel by stacking superconducting wires so that one or more superconducting wires are disposed in the same layer, thus facilitating the formation of the current-limiting element in series or in parallel and obviating the use of a winding machine when manufacturing the current-limiting element.

BACKGROUND ART

These days, the likelihood of fault current in domestic power systems is gradually increasing due to continuously increasing power loads. Additionally, for domestic systems, land is relatively scarce, and thus system lines are relatively short, and the systems are used in the state of being closely connected with each other for easy maintenance and repair, undesirably further increasing the risk of fault current.

Therefore, some breakers preinstalled in domestic transmission lines have to be replaced with new ones, or the lines have to be separated. With the goal of solving these problems, a current limiter is proposed, which is a novel power device for reducing or limiting the fault current of power systems to a level equal to or less than the breaking capacity of preinstalled breakers.

In power systems, a current limiter functions to limit mechanical, thermal and electrical stress, which are applied to bus bars, insulators, breakers and the like when fault current occurs due to system accidents. Because of a continuous increase in the risk of fault current in such systems and a difficulty in developing power devices for coping therewith, the demand for current-limiting elements with which fault current may be controlled is drastically increasing.

Although the development of current limiting techniques that are available in the real world is delayed, attributable to technical difficulties and difficulties in commercialization, high-temperature superconductors are newly discovered, and thus the likelihood of the development of current limiters using the non-linear voltage-current characteristics thereof has come to the fore. The development of high-temperature superconducting current limiters using liquid nitrogen as a refrigerant began in earnest in 1987.

A recent advance in superconducting elements for use in superconducting current limiters takes the form of a resistive superconducting current limiter using superconducting windings. Specifically, the magnet windings are formed into modules, which are then connected in series or in parallel. Depending on the type of winding process, the modules are broadly classified into solenoid modules and pancake modules.

The resistive current limiter and the current limiting module are required to be cooled because of the particularities of the superconductors. That is, the superconductor properties are not lost under the condition that the temperature is equal to or lower than a predetermined level. As for a superconductor used for the current limiter, a very large current flows in the event of fault current.

Such current is referred to quench current, which is equal to or higher than critical current. Resistance upon normal operation is almost ignored, and then instantly great resistance appears, thus causing joule heating. The joule heat thus generated is emitted by the peripheral cooling medium, whereby the superconducting current-limiting element may stably operate without electrical/thermal changes.

In a double pancake configuration for conventional superconducting magnets and current limiter modules, modules, in which an insulator is interposed between superconducting wires wound in pancake form, are connected in series to generate large flux density.

Furthermore, current is allowed to flow in the same direction, and thus a large external mechanical force is always applied to superconducting winding modules, undesirably causing instability thereof.

There is no cooling channel for effectively preventing the local generation of joule heat during operation, and heat is dissipated from the upper and lower surfaces of the windings by the refrigerant, and the inside thereof is cooled through conduction.

As described above, however, the superconducting winding modules in pancake form are manufactured using a stacking process so as to connect the ends thereof and to allow current to flow in the same direction.

The magnetic fields of individual modules generated by the current in the same direction overlap each other, whereby a magnetic field is formed in a predetermined direction in the inside thereof, and individual modules are bonded in different directions for non-inductive windings, thereby allowing the current to flow in opposite directions.

The magnetic fields having the same magnitude generated in a single module flow in opposite directions, and are thus offset, and the inductive component may be decreased, and thus internal flux may disappear, resulting in non-inductive windings.

In the double pancake configuration for superconducting magnets and current limiter modules, the pancake windings are stacked, and the inside of the windings is designed to radiate heat through conduction without the cooling channel, and only the two sharp tips of the superconducting tape are exposed to the refrigerant, so that heat is radiated to the refrigerant.

Thereby, the double pancake configuration for superconducting magnets and current limiter modules is problematic because the thermal energy generated by fault current is not efficiently emitted, and recovery characteristics for normal operation may be deteriorated.

In order to ensure stability against mechanical impacts upon normal operation, a material such as epoxy, which has low thermal conductivity, has to be incorporated into the surface thereof, which may make the emission of thermal energy more difficult.

In this regard, Korean Patent Application Publication No. 2007-0068929 (Current-limiting module for superconducting current limiter, laid-open date: Jul. 2, 2007) is disclosed.

DISCLOSURE

Technical Problem

An object of the present invention is to provide a superconducting current-limiting element for a current limiter, in which the current-limiting element may be formed using bar-shaped superconducting wires that extend in a straight line, without the need for a winding machine.

Another object of the present invention is to provide a superconducting current-limiting element for a current limiter, in which the current-limiting element may be easily expanded in series by stacking bar-shaped superconducting wires in a plurality of layers.

Still another object of the present invention is to provide a superconducting current-limiting element for a current limiter, in which the thicknesses of connection blocks and insulation blocks may be increased or decreased, thereby easily controlling the gaps between the stacked superconducting wires.

Yet another object of the present invention is to provide a superconducting current-limiting element for a current limiter, in which the areas of connection blocks and insulation blocks may be increased or decreased, so that one or more superconducting wires are disposed in parallel in individual layers, thus facilitating expansion of the current-limiting element in parallel.

Technical Solution

In order to accomplish the above objects, the present invention provides an superconducting current-limiting element for a current limiter, comprising: superconducting wires extending in a straight line and stacked in one or more layers; connection blocks and insulation blocks respectively disposed at both ends of the superconducting wires between the stacked superconducting wires so that the connection blocks and the insulation blocks are alternately located in each of the layers; and a terminal provided at each of an end of an uppermost superconducting wire and an end of a lowermost superconducting wire among the stacked superconducting wires.

The superconducting wires may be in a bar shape configured to include a substrate extending in a straight line on one surface thereof and a superconductor provided on the other surface thereof.

Each of the connection blocks may include seating recesses, which are formed in both surfaces thereof coming into contact with the superconducting wires and into which both ends of the superconducting wires are seated.

Each of the connection blocks may include: first mounting recesses formed to a shallower depth than the seating recesses so as to form a stepped portion along a circumference of each of the seating recesses; and connection caps mounted into the first mounting recesses to cover the superconducting wires seated into the seating recesses.

Each of the insulation blocks may include second mounting recesses, which are formed in both surfaces thereof and into which the connection blocks, disposed on and under any one of the insulation blocks, are seated.

Also, solders may be provided between a first surface of the end of the superconducting wire seated into each of the seating recesses and the seating recess and between a second surface of the end of the superconducting wire, opposite the first surface, and the connection cap, so that the superconducting wires and the connection blocks are bonded together.

The solders may have a processing temperature of less than 100° C. but exceeding 0° C.

The superconducting current-limiting element may further comprise: a pair of clamps provided at both sides of each of the uppermost superconducting wire and the lowermost superconducting wire among the stacked superconducting wires; and a support bar having both ends joined to the pair of clamps.

Also, both ends of the support bar, which are passed through the pair of clamps and protrude from the clamps, may be provided with an elastic member for elastically supporting the pair of clamps such that the clamps come into close contact with each other.

The superconducting current-limiting element may further comprise: a pair of holders, which are formed to extend in a height direction of the stacked superconducting wires, include through-holes formed at predetermined intervals along the extension direction, and are disposed at both sides of the stacked superconducting wires; and spacers, both ends of which are fitted into the through-holes and supported by the pair of holders.

Each of the holders may include a groove, which is formed in a direction of extension of the holders and in which the through-holes are formed, and the groove is filled with an adhesive.

The stacked superconducting wires may be connected in parallel so that one or more superconducting wires come into contact with the same connection block and insulation block in each of the layers.

The clamps and the support bar may be removed from the superconducting wires after bonding of the superconducting wires and the connection blocks using the solders provided between the first surface of the end of the superconducting wire seated into each of the seating recesses and the seating recess and between the second surface of the end of the superconducting wire, opposite the first surface, and the connection cap.

In addition, the present invention provides a method of manufacturing a superconducting current-limiting element for a current limiter, comprising: a stacking step of stacking bar-shaped superconducting wires, connection blocks and insulation blocks so that the connection blocks and the insulation blocks are disposed at both ends of the bar-shaped superconducting wires so as to be alternately located; a fastening step of fastening a pair of clamps to both sides of each of an uppermost superconducting wire and a lowermost superconducting wire among the stacked superconducting wires, and joining the pair of clamps with a support bar to apply pressure to the stacked superconducting wires; a gap-maintaining step of fitting both ends of a plurality of spacers, which are aligned by being inserted in a direction perpendicular to a longitudinal direction of the superconducting wires between the stacked superconducting wires, into the holders; and a bonding step of bonding the superconducting wires, the connection blocks, and the insulation blocks.

The stacking step may include: 1) providing solders to seating recesses formed in both surfaces of the connection blocks that come into contact with the superconducting wires, thus seating ends of the superconducting wires into the seating recesses; 2) providing additional solders to ends of the superconducting wires seated into the seating recesses, and mounting connection caps into first mounting recesses formed to a shallower depth than the seating recesses to form stepped portions along circumferences of the seating recesses; 3) seating the connection blocks having the connection caps into second mounting recesses formed in both surfaces of the insulation blocks; and 4) mounting a terminal to each of the uppermost superconducting wire and the lowermost superconducting wire.

The bonding step may include heating the stacked superconducting wires in an oven.

The bonding step may be performed through heating at a temperature of less than 100° C. but exceeding 0° C. in the oven.

The fastening step may include providing both ends of the support bar with an elastic member for elastically supporting the pair of clamps joined by the support bar such that the clamps come into close contact with each other.

The stacking step may include disposing one or more superconducting wires in parallel in the same layer.

Advantageous Effects

According to the present invention, the use of bar-shaped superconducting wires extending in a straight line obviates the need for a winding machine.

Also, bar-shaped superconducting wires can be stacked in a plurality of layers, thereby facilitating expansion of the current-limiting element in series. Even when the current-limiting element is expanded in series in this way, turn-to-turn voltage can be maintained constant depending on the current direction.

Thus, even when the current-limiting element is expanded in series, no additional insulation is required.

As the thicknesses of connection blocks and insulation blocks are increased or decreased, it is easy to control the gaps between the stacked superconducting wires, thus making it possible to realize an appropriate design depending on which factor, selected from among cooling performance and the loss of alternating current flowing in opposite directions in the superconducting wires in individual layers, is deemed important.

Furthermore, the areas of connection blocks and insulation blocks are increased or decreased, whereby one or more superconducting wires are disposed in parallel in individual layers, thus facilitating expansion of the current-limiting element in parallel.

Figure 1:
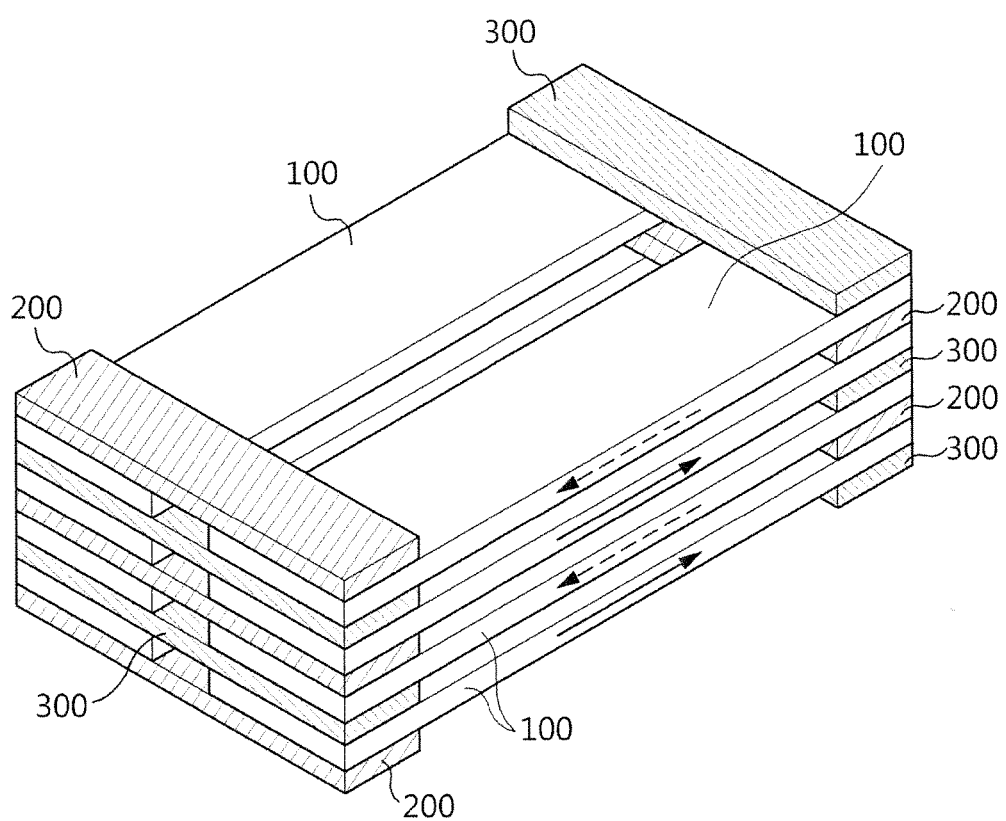
FIG. 1 schematically illustrates the structure of a current-limiting element according to the present invention.

| *Description of the Reference Numerals in the Drawings* | |
| --- | --- |
| 10: clamp | 20: support bar |
| 30: holder | 31: through hole |
| 32: groove | 40: spacer |
| 100: superconducting wire | 110: substrate |
| 120: superconductor | 200: connection block |
| 210: seating recess | 220: first mounting recess |
| 230: connection cap | 300: insulation block |
| 310: second mounting recess | 400: solder |
| 500: terminal | |

BEST MODE

The present invention will be described in detail below with reference to the accompanying drawings. In the following description, redundant descriptions and detailed descriptions of known functions and elements that may unnecessarily make the gist of the present invention obscure will be omitted. Embodiments of the present invention are provided to fully describe the present invention to those having ordinary knowledge in the art to which the present invention pertains. Accordingly, in the drawings, the shapes and sizes of elements may be exaggerated for the sake of clearer description.

Figure 2A:
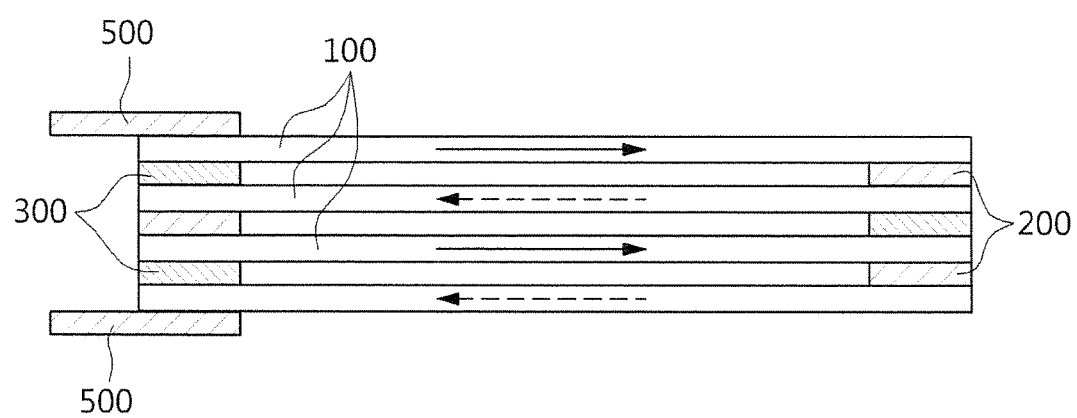
FIGS. 2A and 2B are side views illustrating the current-limiting element of FIG. 1.
Figure 2B:
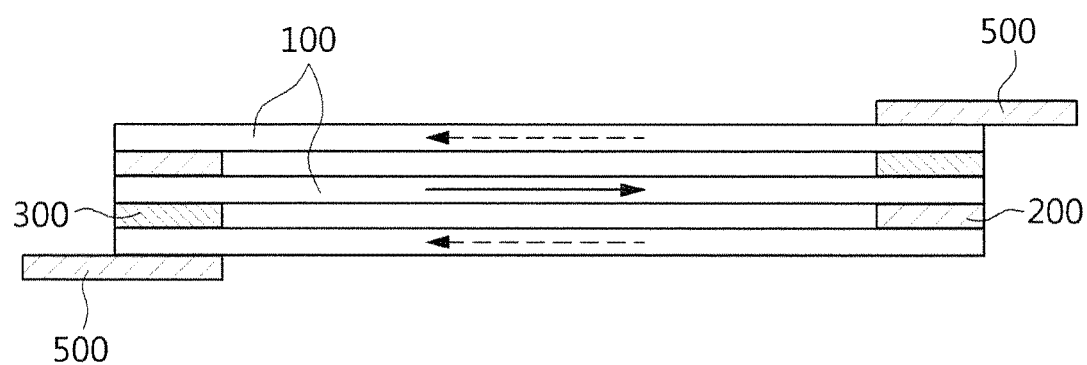

FIG. 1 schematically illustrates the structure of a current-limiting element according to the present invention, and FIGS. 2A and 2B are side views illustrating the current-limiting element of FIG. 1.

With reference to FIGS. 1, 2A and 2B, the superconducting current-limiting element for a current limiter according to the present invention includes superconducting wires 100 extending in a straight line and stacked in one or more layers, connection blocks 200 and insulation blocks 300 respectively disposed at both ends of the superconducting wires 100 between the stacked superconducting wires 100 so that the connection blocks and the insulation blocks are alternately located in each of the layers, and a terminal 500 provided at each of the end of the uppermost superconducting wire 100 and the end of the lowermost superconducting wire 100, among the stacked superconducting wires 100.

Describing the flow of current through the current-limiting element with reference to FIGS. 2A and 2B, when current is fed through the upper terminal 500, the current flows to a position opposite the terminal 500 along the uppermost superconducting wire 100 and is then introduced to a first superconducting wire 100 located directly under the uppermost superconducting wire through a connection block 200 thereunder. Further, the current flows to a position opposite the connection block 200 and then flows along a second superconducting wire 100 located directly under the first superconducting wire through a connection block 200 thereunder.

As illustrated in FIGS. 2A and 2B, the terminals 500 may be freely mounted at any position depending on the design of the current-limiting element according to the present invention.

As the insulation blocks 300 are provided at positions opposite the connection blocks 200, current does not directly flow from the upper terminal 500 to the lower terminal 500, but may flow in zigzag form along the stacked superconducting wires 100.

In the present invention, the superconducting wires 100 are provided in the shape of a bar, configured to include a substrate 110 extending in a straight line on one surface thereof and a superconductor 120 provided on the other surface thereof.

Figure 3:
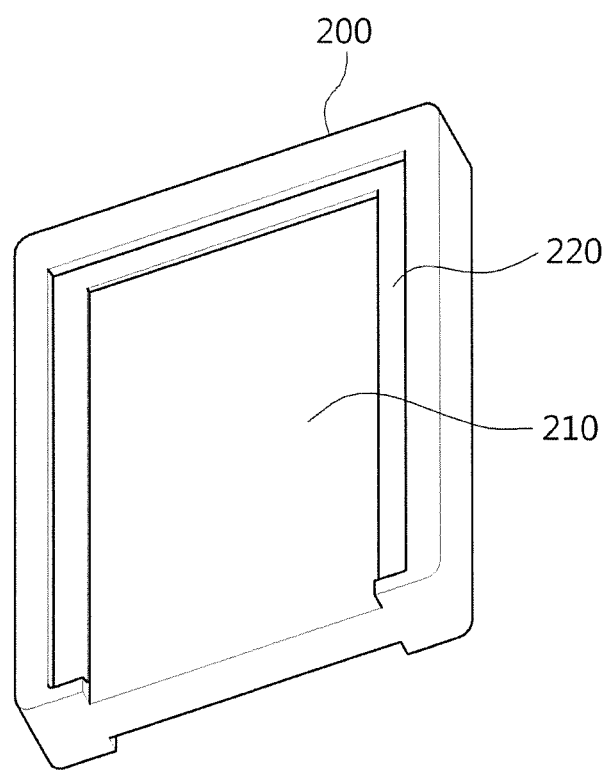
FIG. 3 illustrates a connection block according to the present invention.
Figure 4:
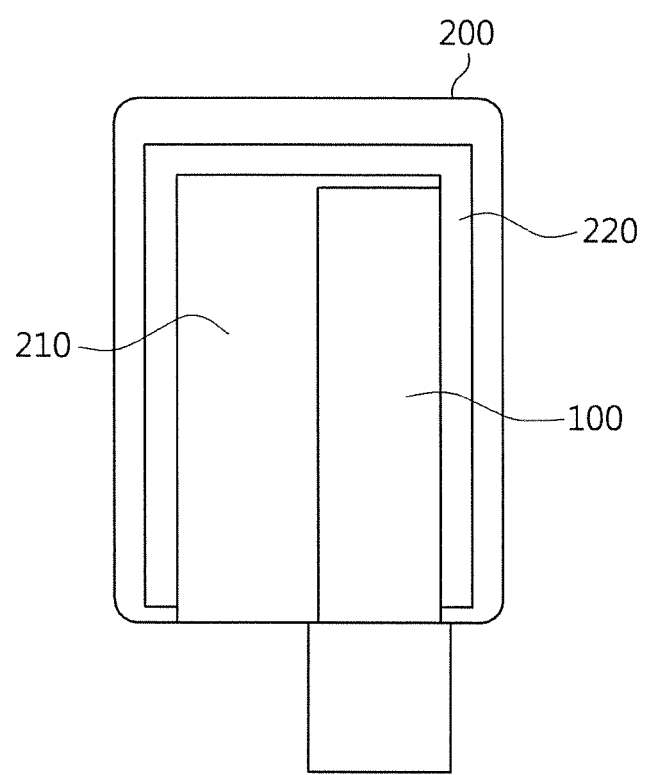
FIG. 4 illustrates seating of a superconducting wire into the connection block according to the present invention.

FIG. 3 illustrates the connection block 200 according to the present invention, and FIG. 4 illustrates seating of the superconducting wire 100 into the connection block 200 according to the present invention.

The connection blocks 200 enable the current to flow to individual superconducting wires 100 between the stacked superconducting wires 100, and may be manufactured using copper, which has high conductivity, in the present invention.

The connection blocks 200 are configured to include seating recesses 210, which are formed in both surfaces thereof coming into contact with the superconducting wires 100, such that both ends of the superconducting wires 100 are seated into the seating recesses.

As illustrated in FIG. 4, a superconducting wire 100 is seated into a portion of the seating recess 210, and an additional superconducting wire 100 is seated into the adjacent position, thereby doubling the area for the superconducting wires 100 through which current may flow. When the areas of the connection blocks 200 and the seating recesses 210 are increased in this way, the current-limiting element according to the present invention may be easily expanded in parallel.

As described above, each of the superconducting wires is configured such that a substrate 110 is provided on one surface thereof and the superconductor 120 is provided on the other surface thereof. As shown in FIGS. 1 and 2, when such superconducting wires 100 are stacked, the substrate 110 of the superconducting wire 100 comes into contact with either of the seating recesses 210 formed in both surfaces of the connection block 200.

Accordingly, the magnitude of resistance increases somewhat between the connection blocks 200 in contact with the substrates 110 of the superconducting wires 100, thus causing current loss.

To solve this problem, in the present invention, the connection blocks 200 each include first mounting recesses 220, formed to a shallower depth than the seating recesses 210 so as to form a stepped portion along the circumference of each of the seating recesses 210, and connection caps 230, which are mounted into the first mounting recesses 220 to cover the superconducting wires 100 seated into the seating recesses 210.

Each first mounting recess 220 is provided in the form of a band by being depressed to a shallower depth along the circumference of the seating recess 210, and comes into contact with the edge of the connection cap 230, whereby current flowing through the connection cap 230 and the superconductor 120 of the superconducting wire 100 may be applied to the connection block 200 via the connection cap 230.

FIGS. 5A to 5D illustrate various examples for seating the superconducting wires 100 into the connection block 200 according to the present invention.

Figure 5A:
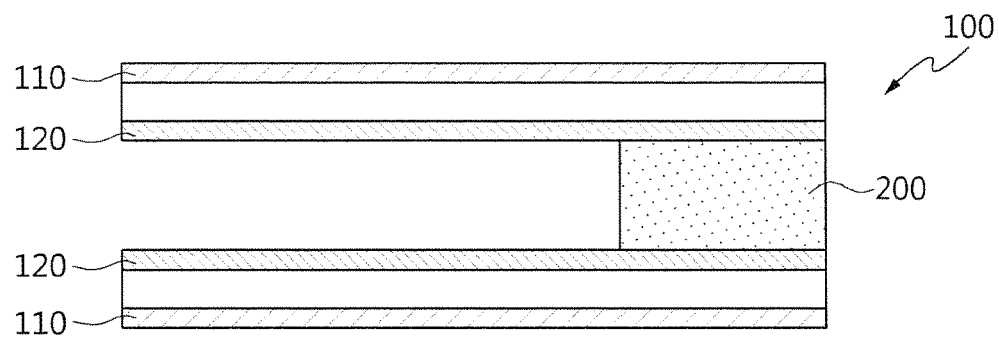
FIGS. 5A to 5D illustrate various examples for seating superconducting wires into the connection block according to the present invention.
Figure 5B:
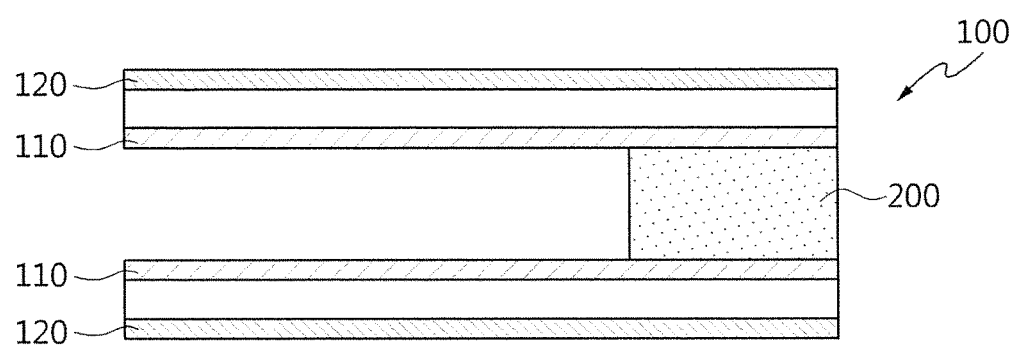

Resistance is measured on the bonding surfaces of the superconducting wires 100 comprising the substrates 110 and the superconductors 120, as shown in FIGS. 5A to 5D, in which the bonding resistance is about 0.3μΩ in FIG. 5A, and is remarkably increased to about 7μΩ in FIG. 5B.

Figure 5C:
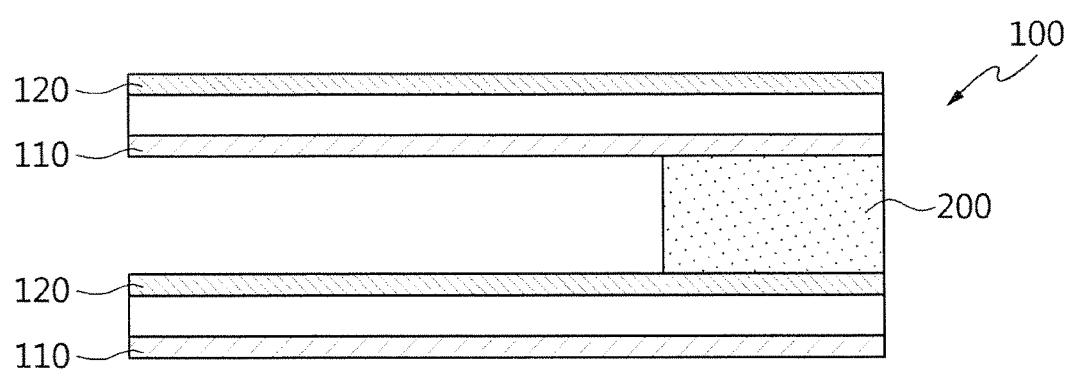

In FIG. 5C, showing the typical bonding using the bar-shaped superconducting wires 100, a resistance of about 3.7 μΩ is generated. As the connection cap 230 is provided in the present invention, the bonding resistance is measured to be 0.47 μΩ in FIG. 5D, which is close to the lowest bonding resistance of FIG. 5A.

Figure 5D:
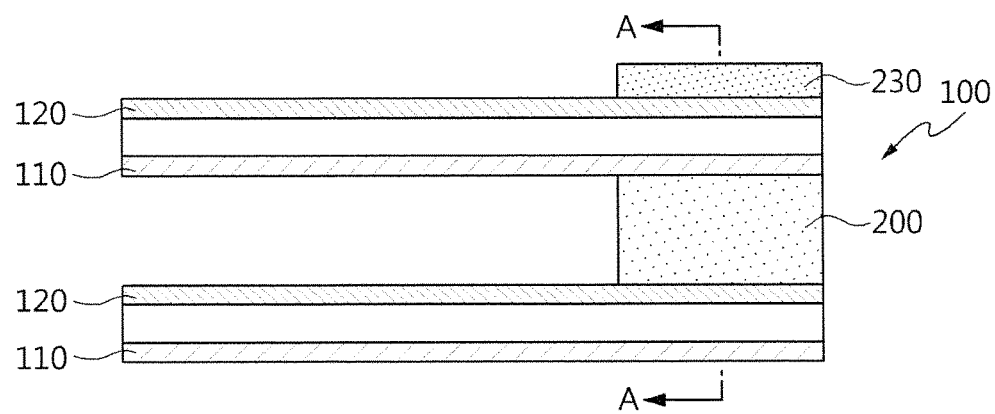
Figure 6:
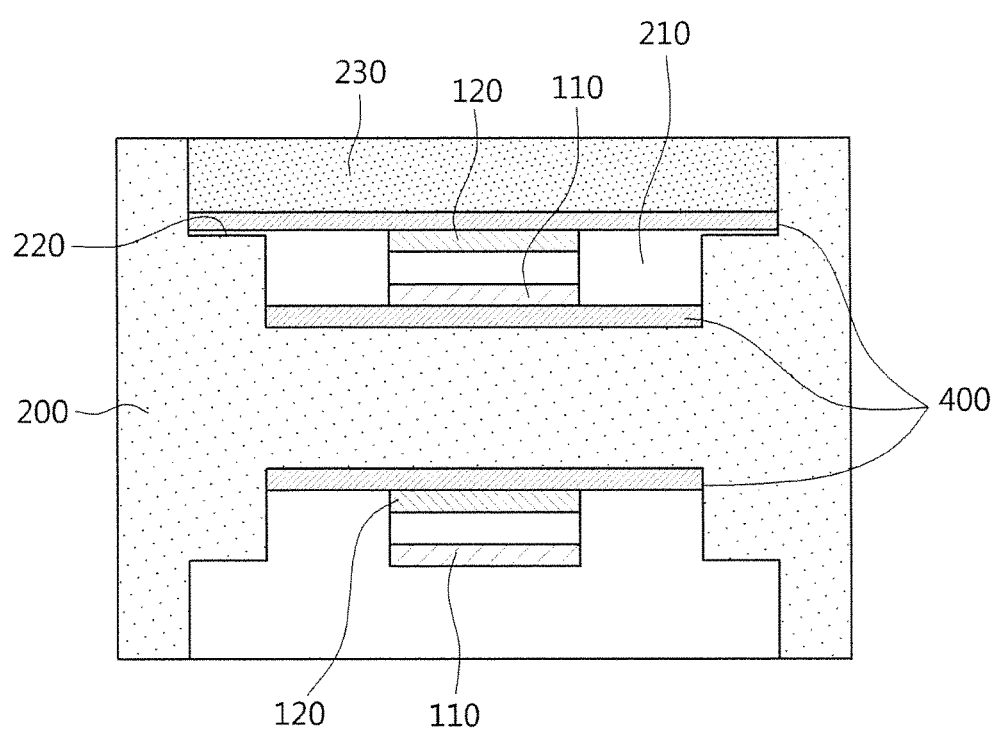
FIG. 6 is a cross-sectional view taken along the line A-A of FIG. 4.

Minimizing the bonding resistance as shown in FIG. 5D is exemplarily illustrated in FIG. 6, which is a cross-sectional view taken along the line A-A of FIG. 4.

According to the present invention, the superconducting current-limiting element is advantageous in that, even when the current-limiting element is expanded in series using the bar-shaped superconducting wires 100, turn-to-turn voltage at which the flow direction of current is converted is not increased but is always constant, thereby enabling expansion in series without additional insulation.

Figure 7:
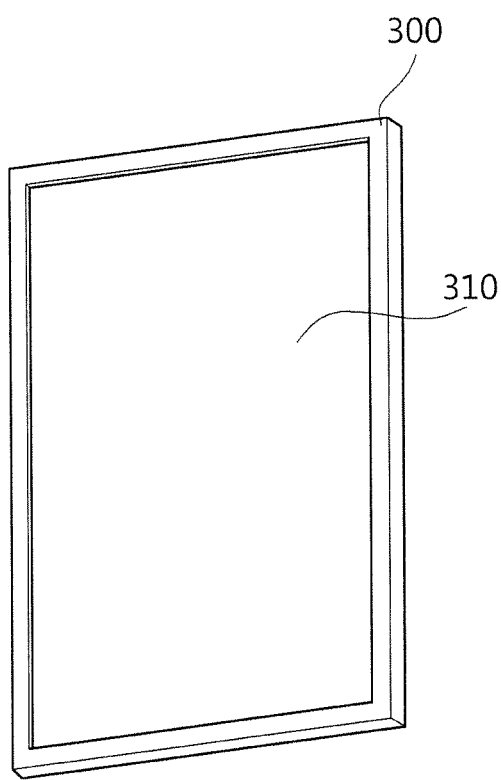
FIG. 7 illustrates an insulation block according to the present invention.

FIG. 7 illustrates the insulation block 300 according to the present invention.

Each of the insulation blocks 300 includes second mounting recesses 310 formed in both surfaces thereof, into which the connection blocks 200, disposed on and under any one of the insulation blocks 300, are seated with the superconducting wires 100 interposed therebetween.

Therefore, the insulation blocks 300 have a larger area than the connection blocks 200.

Figure 8:
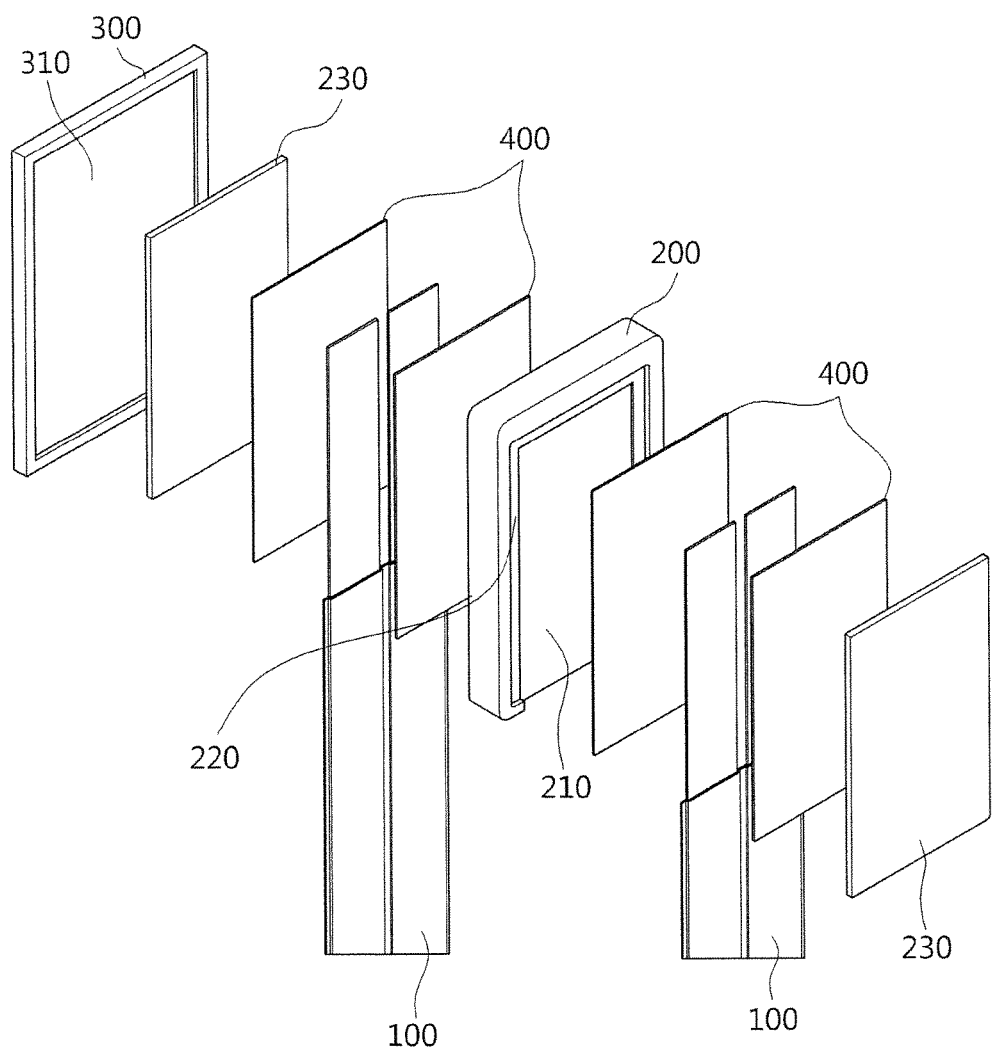
FIG. 8 illustrating joining of the superconducting wires, the connection blocks and the insulation blocks according to the present invention.

FIG. 8 illustrates the joining of the superconducting wires, the connection blocks 200 and the insulation blocks 300 according to the present invention.

With reference to FIG. 8, the superconducting wires 100 are disposed at both surfaces of the connection blocks 200.

The end of each of the superconducting wires 100, comprising the substrate 110 at one surface thereof and the superconductor 120 at the other surface thereof, is exposed externally, and the remaining portion thereof is covered with an insulating material.

In the superconducting wire 100, respective upper surfaces of the substrate 110 and the superconductor 120, which are externally exposed, are provided with solders 400 in sheet form.

The solders 400 function to join the superconducting wires 100 and the connection blocks 200 when heat is applied thereto.

The ends of the superconducting wires 100, both surfaces of which are covered with the solders 400, are seated into the seating recesses 210 of the connection blocks 200, and the connection caps 230 are mounted into the first mounting recesses 220.

The insulation blocks 300 are disposed at both surfaces of the connection blocks 200 having the connection caps 230 mounted thereto, so that the connection blocks 200 are seated into the second mounting recesses 310.

Although not shown in FIG. 8, the insulation blocks 300 and the connection blocks 200 are disposed in zigzag form in such a manner that the insulation block 300 is located at a position opposite the connection block 200 between the two superconducting wires 100.

Figure 9:
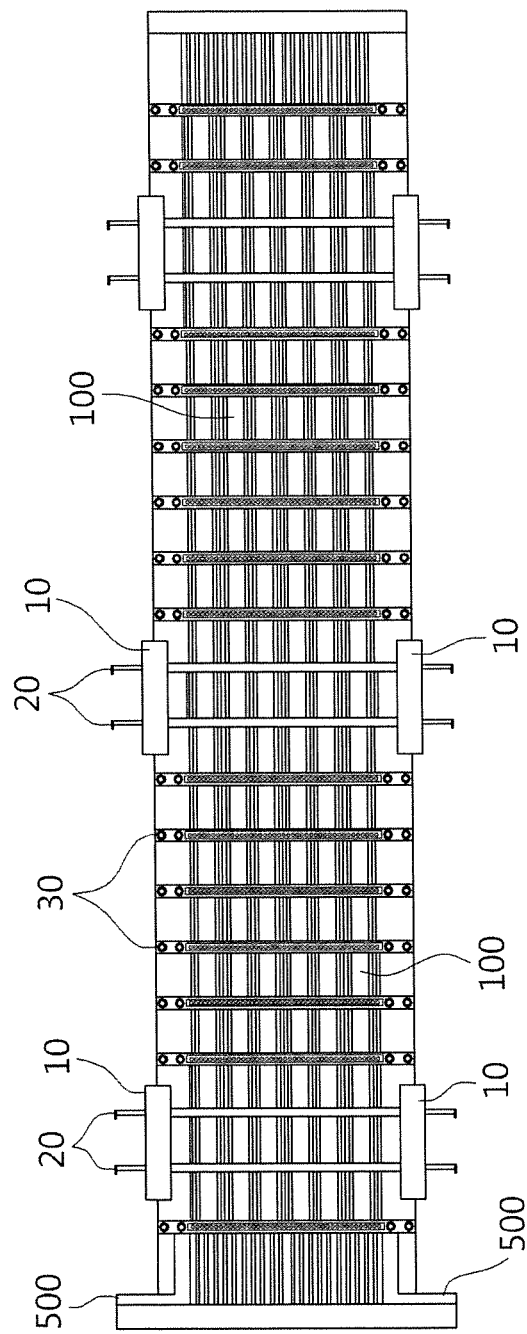
FIG. 9 illustrates bonding of the current-limiting element according to the present invention.

FIG. 9 illustrates bonding of the current-limiting element according to the present invention.

The solders 400 are melted when heat is applied thereto, whereby the superconducting wires 100 may be joined with the connection blocks 200 and the connection caps 230. As shown in FIG. 9, the current-limiting element constructed as shown in FIG. 8 is placed in an oven and then heated.

Here, the superconducting wires 100 in individual layers must not be spaced apart from each other, but must be firmly fixed so as to prevent the performance of the current-limiting element from deteriorating. To this end, in the present invention, the current-limiting element according to the present invention includes a pair of clamps 10 provided at both sides of each of the uppermost superconducting wire 100 and the lowermost superconducting wire 100, among the stacked superconducting wires 100, and support bars having both ends joined to the pair of clamps 10.

The pair of clamps 10 is disposed at each of the upper and the lower position of the stacked superconducting wires 100. In order to apply uniform pressure, the pair of clamps 10 is preferably provided at both surfaces of the superconducting wire 100.

Depending on the length of the superconducting wires 100, a plurality of clamps 10 may be provided.

The support bars 20 are provided in the height direction of the stacked superconducting wires 100 so as to firmly fix the clamps 10 provided at the upper and the lower position of the superconducting wires 100.

The solders 400 preferably have a processing temperature of less than 100° C. but exceeding 0° C. to prevent the superconducting wires 100 from being damaged due to heat in an oven.

When the current-limiting element is placed in the oven and heated, the solders 400 are melted. As the solders 400 are melted in this way, the superconducting wires 100 may become spaced apart from the connection blocks 200 and the connection caps 230, undesirably causing defects of the current-limiting element.

To overcome this problem, both ends of the support bars 20, which are passed through the pair of clamps 10 and protrude from the clamps 10, are provided with elastic members for elastically supporting the pair of clamps 10 such that the clamps 10 come into close contact with each other, thereby preventing the superconducting wires 100 from being spaced apart from the connection caps 230 and the seating recesses 210 when the solders 400 are melted.

In the present invention, spring nuts (not shown) are used as the elastic members to join the clamps 10 with the support bars 20.

Meanwhile, the stacked superconducting wires 100 are subjected to compressive force by the clamps 10 and the support bars 20, and thus the center portions of the superconducting wires 100 may warp.

In order to prevent such warping, in the present invention, spacers 40 are provided between the superconducting wires 100, and holders 30, into which both ends of the spacers 40 are fitted, are used to fix the spacers 40.

Figure 10:
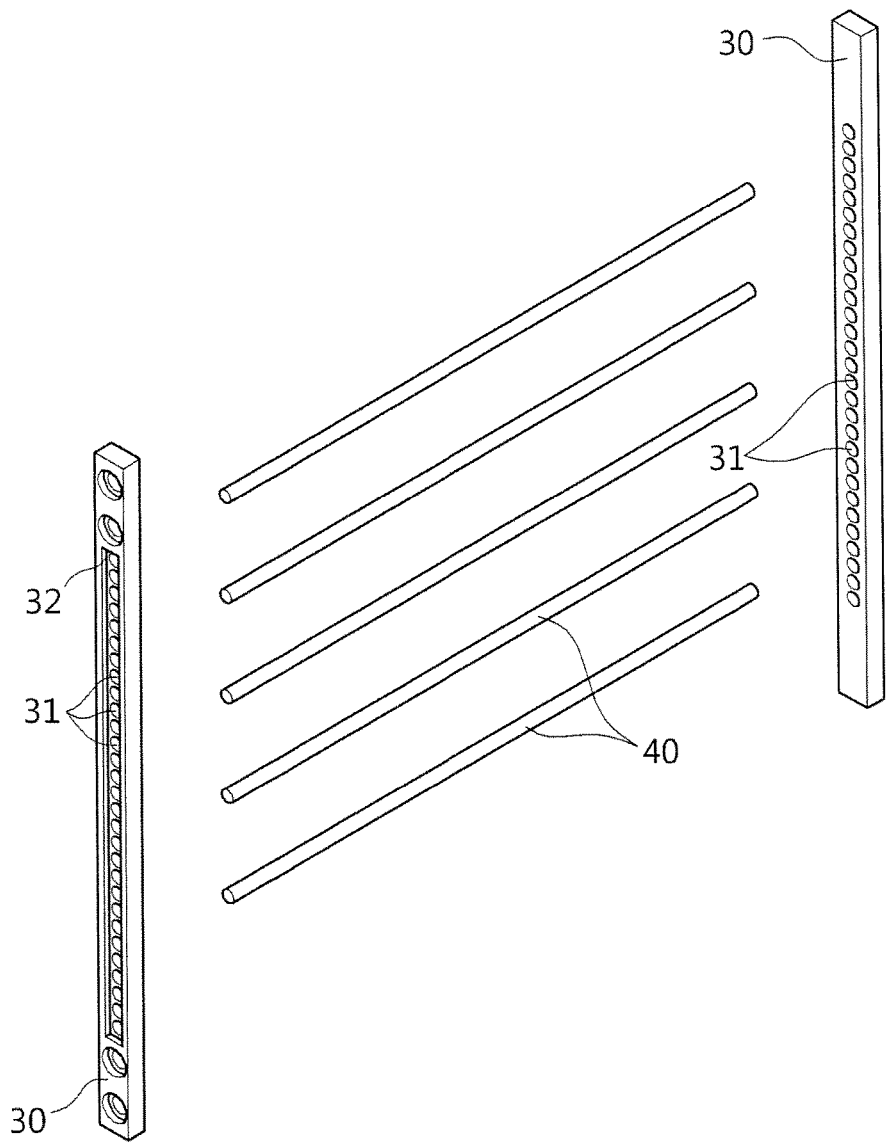
FIG. 10 illustrates holders and spacers according to the present invention.

FIG. 10 illustrates the holders 30 and the spacers 40 according to the present invention.

As illustrated in FIG. 10, the holders 30 may be formed to extend in the height direction of the stacked superconducting wires 100, may include through-holes 31 formed at predetermined intervals along the extension direction, and are arranged in a pair on both sides of the stacked superconducting wires 100.

The spacers 40 are inserted between the stacked superconducting wires 100 and are supported by the pair of holders 30 provided on respective sides of the superconducting wires 100.

As described above, the gaps between the superconducting wires 100 of the current-limiting element according to the present invention may be easily controlled by adjusting the thicknesses of the connection blocks 200 and the insulation blocks 300, and thus, the spacers 40 may be fitted into appropriate through-holes 31.

The holders 30 have grooves 32 formed along the extension direction thereof, in which the through-holes 31 are formed, and the grooves 32 are filled with an adhesive after connection of the holders 30 and the spacers 40, thereby securely joining the holders 30 and the spacers 40.

Figure 11:
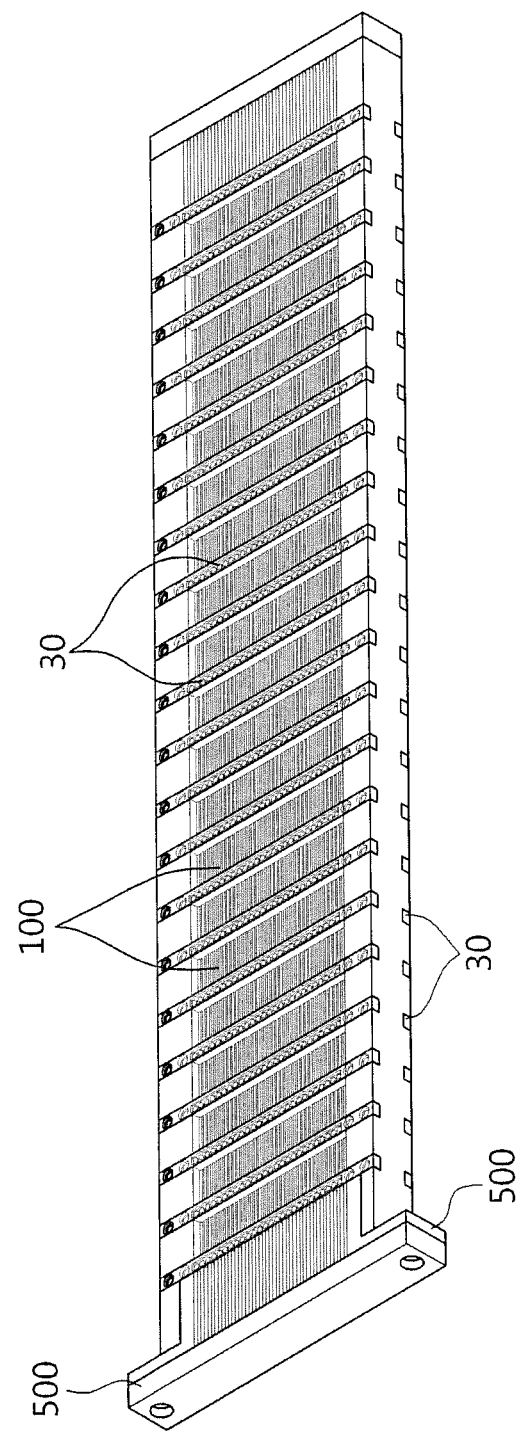
FIG. 11 is a perspective view illustrating a current-limiting element according to the present invention.

The clamps 10 and the support bars 20 are removed after the processing of the solders 400 in the oven. In the current-limiting element according to the present invention as seen in FIG. 11, however, the holders 30 and the spacers 40 are used in the state of being mounted to the current-limiting element. As such, an epoxy adhesive is preferably used so as to avoid deterioration of the adhesion of the adhesive even at cryogenic temperatures.

The superconducting current-limiting element for a current limiter according to the present invention is manufactured as follows.

Figure 12:
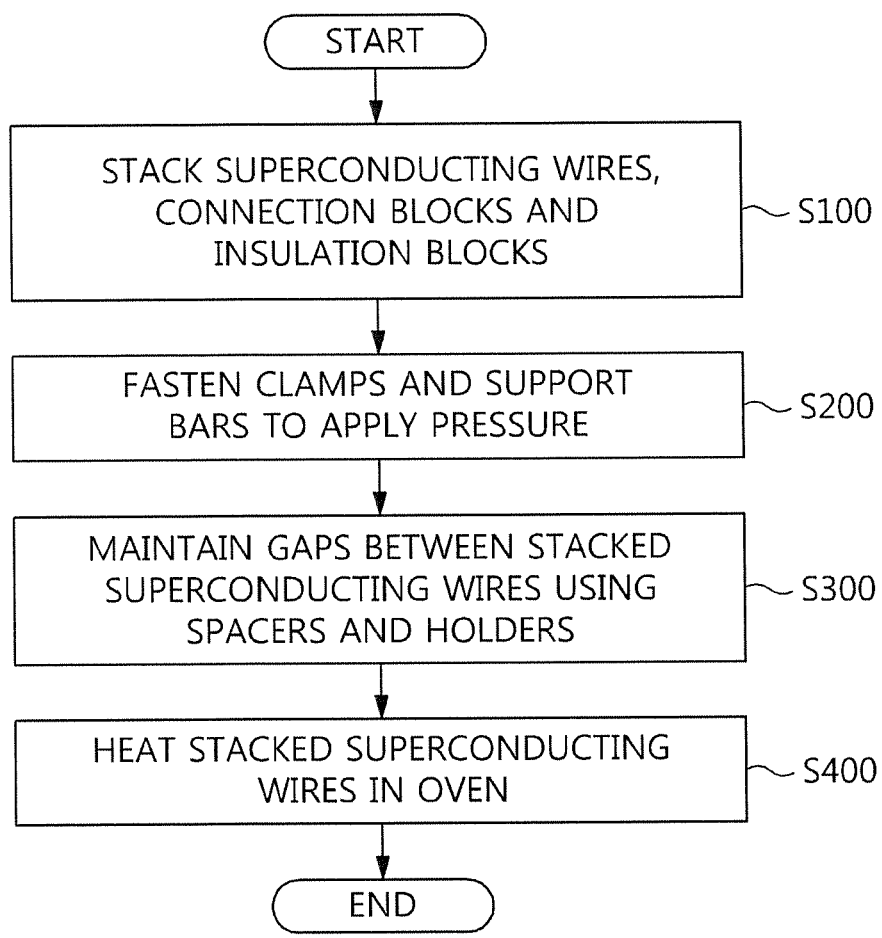
FIG. 12 is a flowchart illustrating the process of manufacturing a superconducting current-limiting element for a current limiter according to the present invention.
Figure 13:
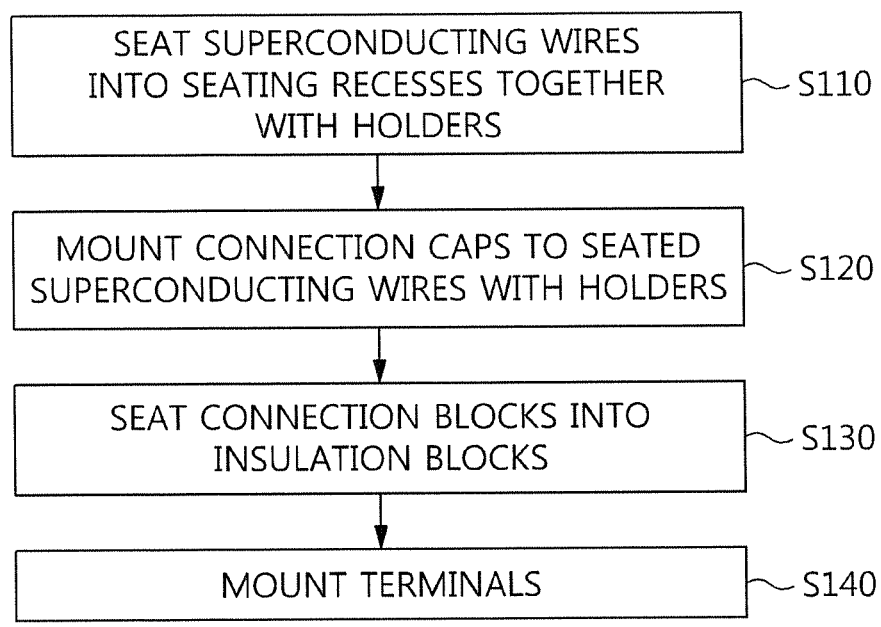
FIG. 13 is a flowchart illustrating the stacking step of FIG. 12.

FIG. 12 is a flowchart illustrating the process of manufacturing the superconducting current-limiting element for a current limiter according to the present invention, and FIG. 13 is a flowchart illustrating the stacking step of FIG. 12.

With reference to FIGS. 12 and 13, the method of manufacturing the superconducting current-limiting element for a current limiter comprises: a stacking step (S100) of stacking bar-shaped superconducting wires 100, connection blocks 200 and insulation blocks 300 so that the connection blocks 200 and the insulation blocks 300 are disposed at both ends of the bar-shaped superconducting wires 100 so as to be alternately located; a fastening step (S200) of fastening a pair of clamps 10 to both sides of each of the uppermost superconducting wire 100 and the lowermost superconducting wire 100, among the stacked superconducting wires 100, and joining the pair of clamps 10 with support bars 20 to apply pressure to the stacked superconducting wires 100; a gap-maintaining step (S300) of fitting both ends of a plurality of spacers 40, which are aligned by being inserted in a direction perpendicular to the longitudinal direction of the superconducting wires 100 between the stacked superconducting wires 100, into holders 30; and a bonding step (S400) of bonding the superconducting wires 100, the connection blocks 200, and the insulation blocks 300.

Specifically, the stacking step (S100) comprises: providing solders 400 to the seating recesses 210 formed in both surfaces of the connection blocks 200 coming into contact with the superconducting wires 100, thus seating the ends of the superconducting wires 100 into the seating recesses (S110); and providing additional solders 400 to the ends of the superconducting wires 100, seated into the seating recesses 210, and mounting connection caps 230 into the first mounting recesses 220 formed to a shallower depth than the seating recesses 210 so as to form stepped portions along the circumferences of the seating recesses 210 (S120).

Further, seating the connection blocks 200 having the connection caps 230 into the second mounting recess 310 formed in both surfaces of the insulation blocks 300 (S130) and respectively mounting terminals 500 to the uppermost superconducting wire 100 and the lowermost superconducting wire 100 (S140) are performed, thereby stacking the superconducting wires 100, the connection blocks 200, and the insulation blocks 300, resulting in a current-limiting element module.

After the completion of the bonding step (S400), the clamps 10 and the support bars 20 are removed from the superconducting wires 100, thereby completing the fabrication of the current-limiting element according to the present invention.

Figure 14:
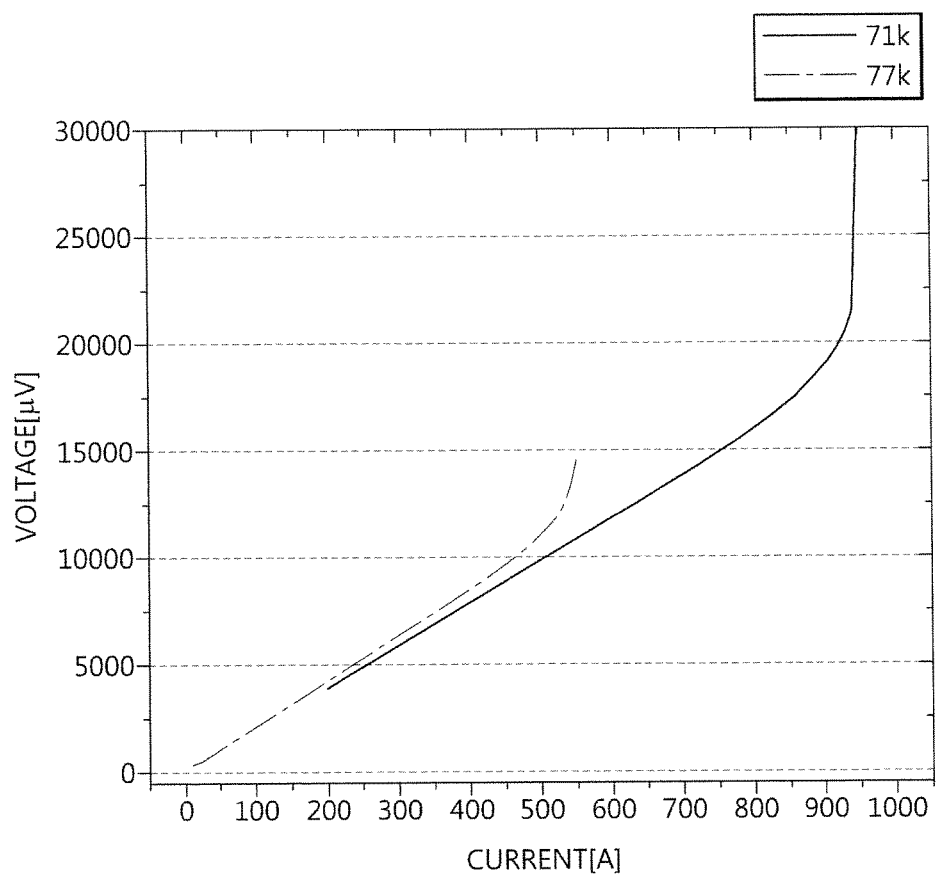
FIG. 14 is a graph illustrating the results of measurement of critical current including normal conductive resistance.
Figure 15:
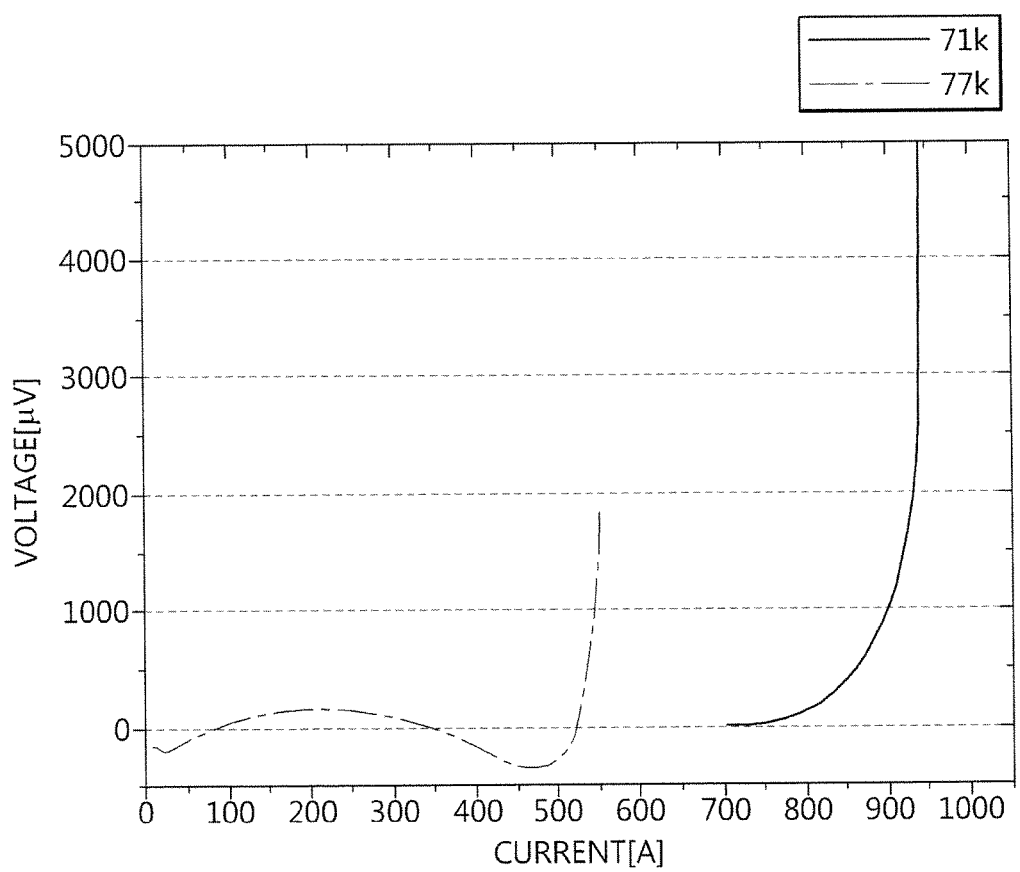
FIG. 15 is a graph illustrating the results of measurement of critical current not including normal conductive resistance.

FIG. 14 is a graph illustrating the results of measurement of critical current including normal conductive resistance, and FIG. 15 is a graph illustrating the results of measurement of critical current not including normal conductive resistance.

In order to measure the critical current using the current-limiting element according to the present invention, FIG. 14 shows the results of measurement of critical current including normal conductive resistance, which includes bonding resistance and resistance generated from the connection blocks 200 made of copper, and FIG. 15 shows the results of measurement of critical current after forced removal of the normal conductive resistance. As shown in the graphs of FIGS. 14 and 15, to determine critical current at 1 µV/cm, the critical current is about 550 A at an absolute temperature of 77 K, and is about 945 A at an absolute temperature of 71 K, and these critical current values are almost the same as each other.

Figure 16:
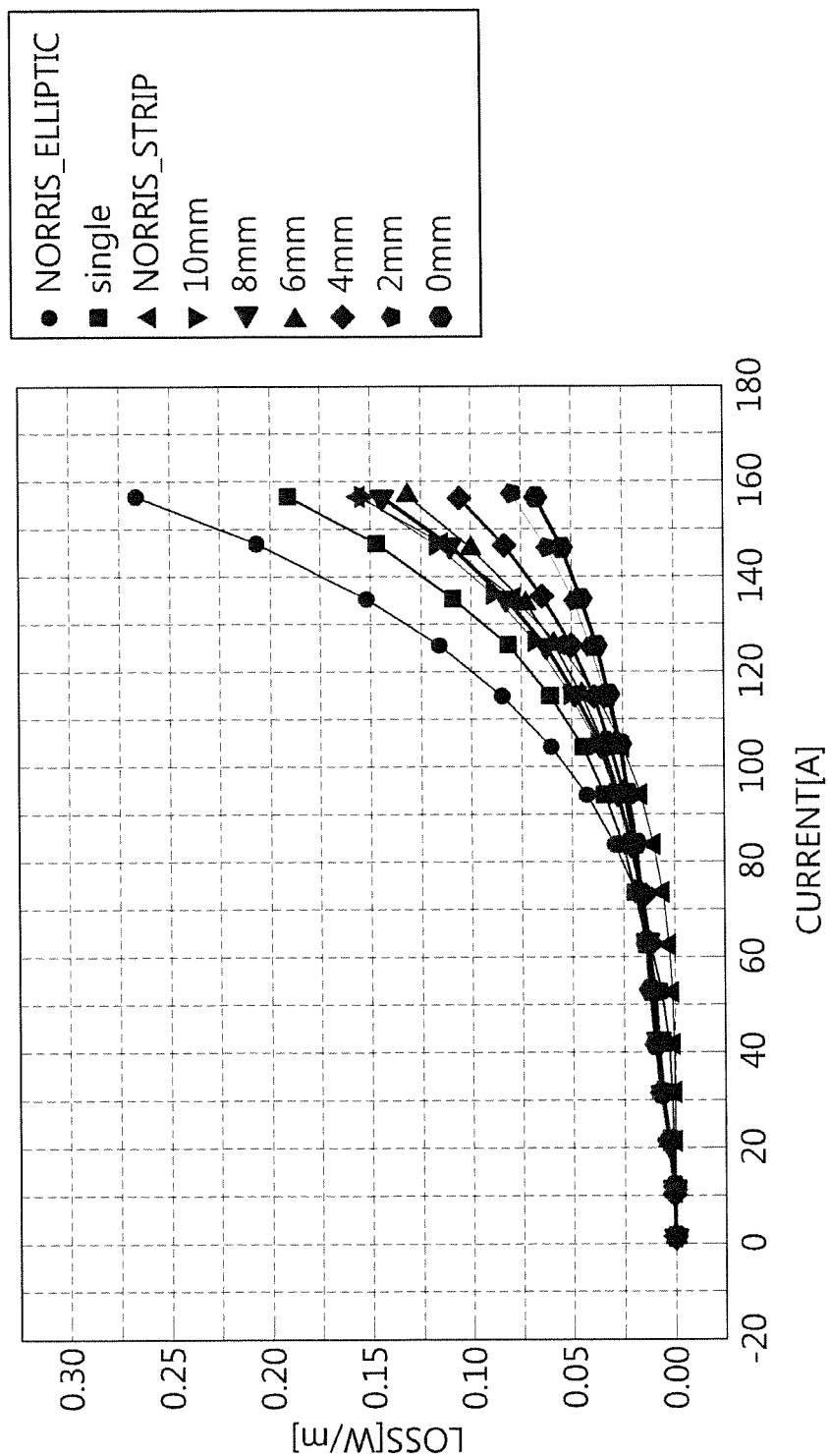
FIG. 16 is a graph illustrating the extent of loss of alternating current depending on the turn-to-turn distance of superconducting wires in individual layers.

FIG. 16 is a graph illustrating the extent of loss of alternating current depending on the turn-to-turn distance of the superconducting wires 100 in individual layers.

In the current-limiting element according to the present invention, the turn-to-turn distance at which the direction of current flowing through the stacked superconducting wires 100 is converted may be readily adjusted, thus minimizing allowable turn-to-turn insulation voltage and cooling effects.

When the length of the superconducting wires 100 is set at 1 m, the turn-to-turn maximum voltage is less than about 150 Vrms (effective). Thus, insulation is regarded as negligible in terms of the dielectric strength of liquid nitrogen for cooling the superconducting current-limiting element.

When a channel is formed to circulate liquid nitrogen, the turn-to-turn distance may not be problematic.

As shown in FIG. 16, as the turn-to-turn distance is decreased, the magnitude of alternating current loss is reduced. When the turn-to-turn distance is about 2 mm, the loss is remarkably decreased.

In FIG. 16, 'single' represents the alternating current loss of a single superconducting wire 100, 'Norris_elliptic' represents the alternating current loss of an elliptic type model proposed by Norris, 'Norris_strip' represents the alternating current loss of a strip type model proposed by Norris, and 0 to 10 mm designates the alternating current loss when the turn-to-turn distance of the superconducting wire 100 having a length of 1 m is 0 to 10 mm.

Figure 17:
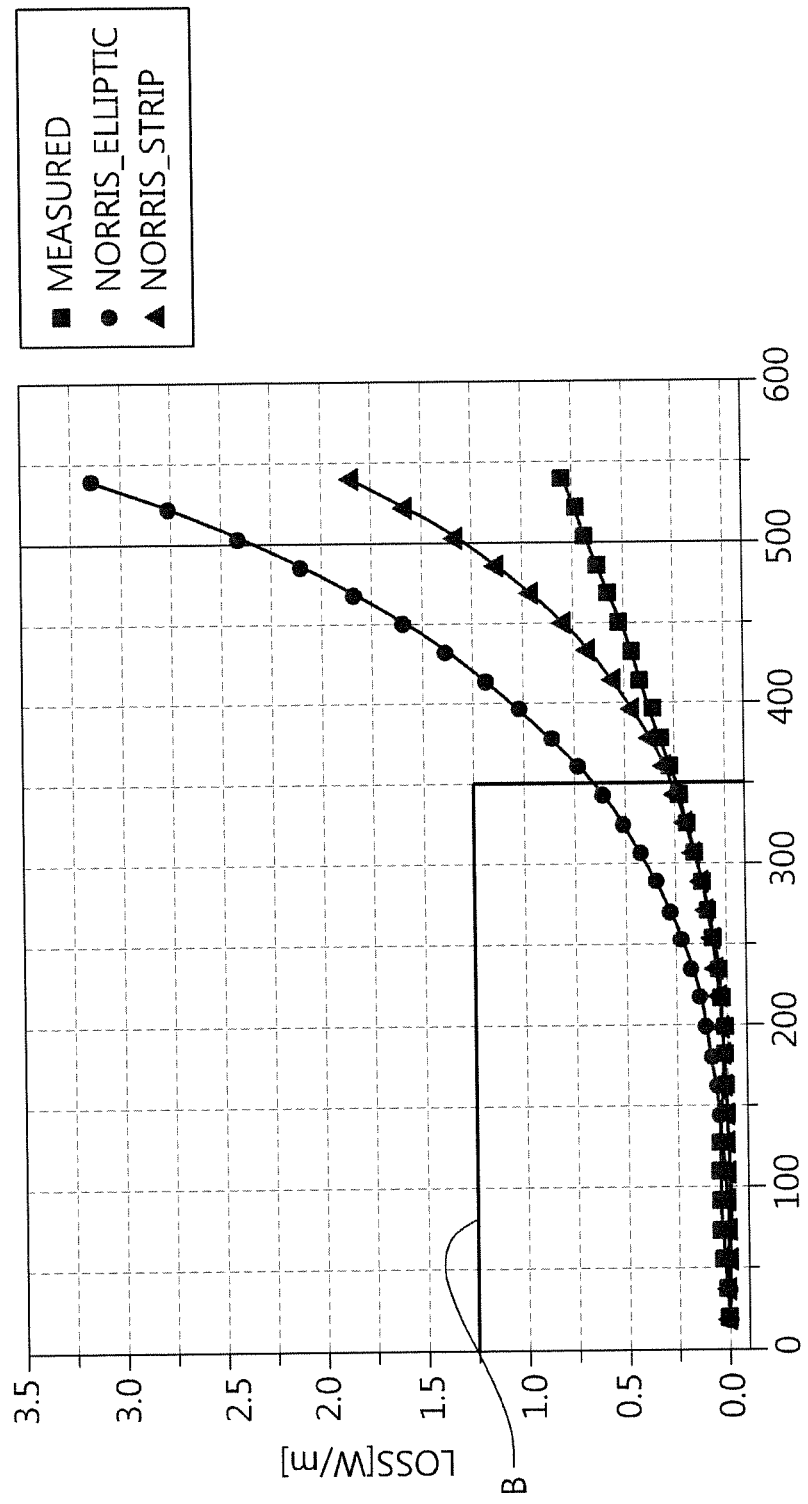
FIG. 17 is a graph illustrating the extent of loss of alternating current of the current-limiting element according to the present invention.
Figure 18:
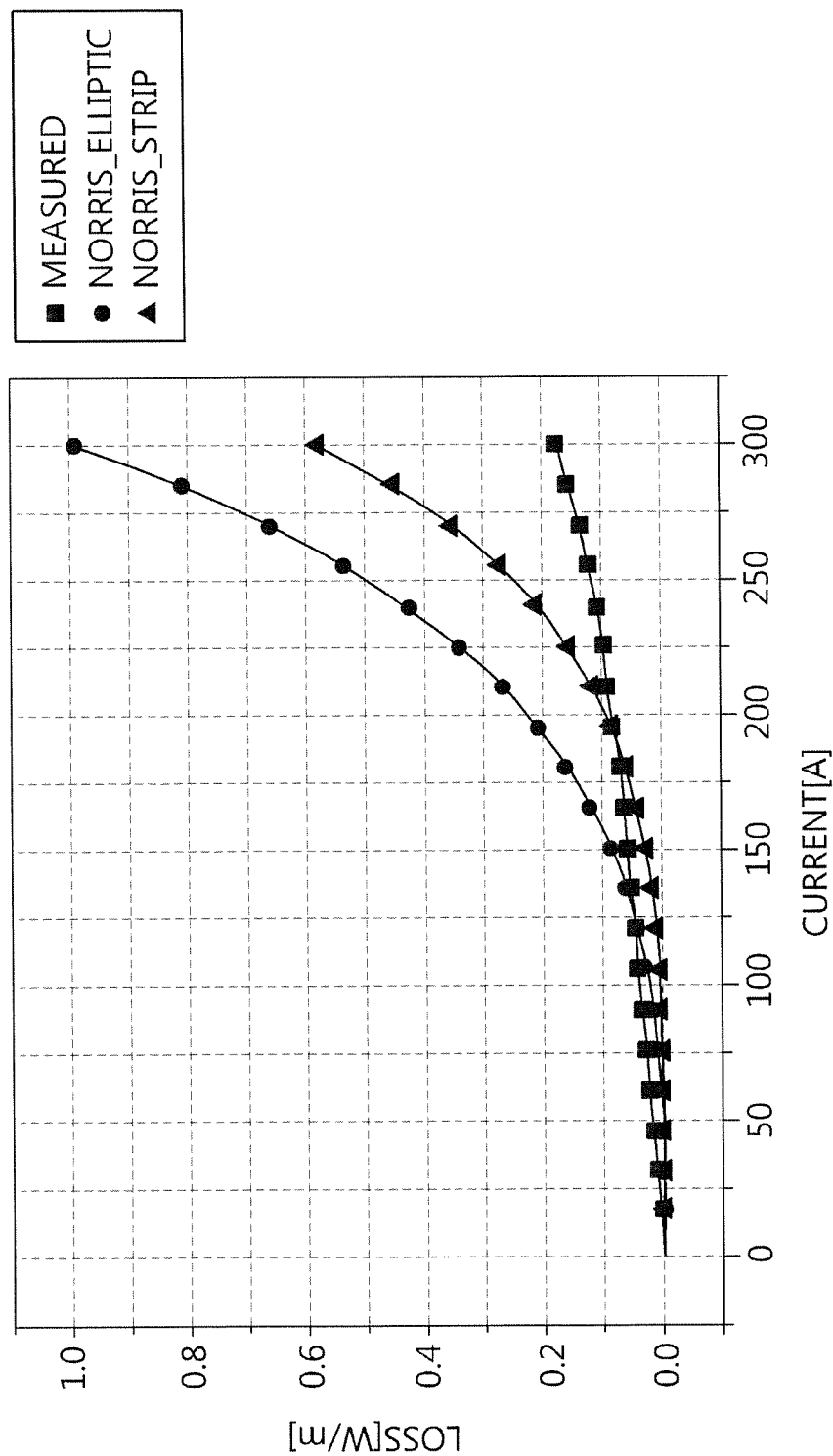
FIG. 18 is an enlarged view of Region B of FIG. 17.

FIG. 17 is a graph illustrating the alternating current loss of the current-limiting element according to the present invention, and FIG. 18 is an enlarged view of Region B of FIG. 17.

Unlike FIG. 16, showing the alternating current loss of a single superconducting wire 100, FIG. 17 illustrates the alternating current loss of the current-limiting element in module form obtained by stacking a plurality of superconducting wires 100 (corresponding to 'measured' in FIGS. 17 and 18). As is apparent from FIG. 17 and FIG. 18, which is an enlarged view of Region B of FIG. 17, compared to FIG. 16 in which the single wire is used, the alternating current loss is smaller in the 'measured' than in the elliptic type model and the strip type model based on the Norris equation, which estimates the critical current.

Figure 19:
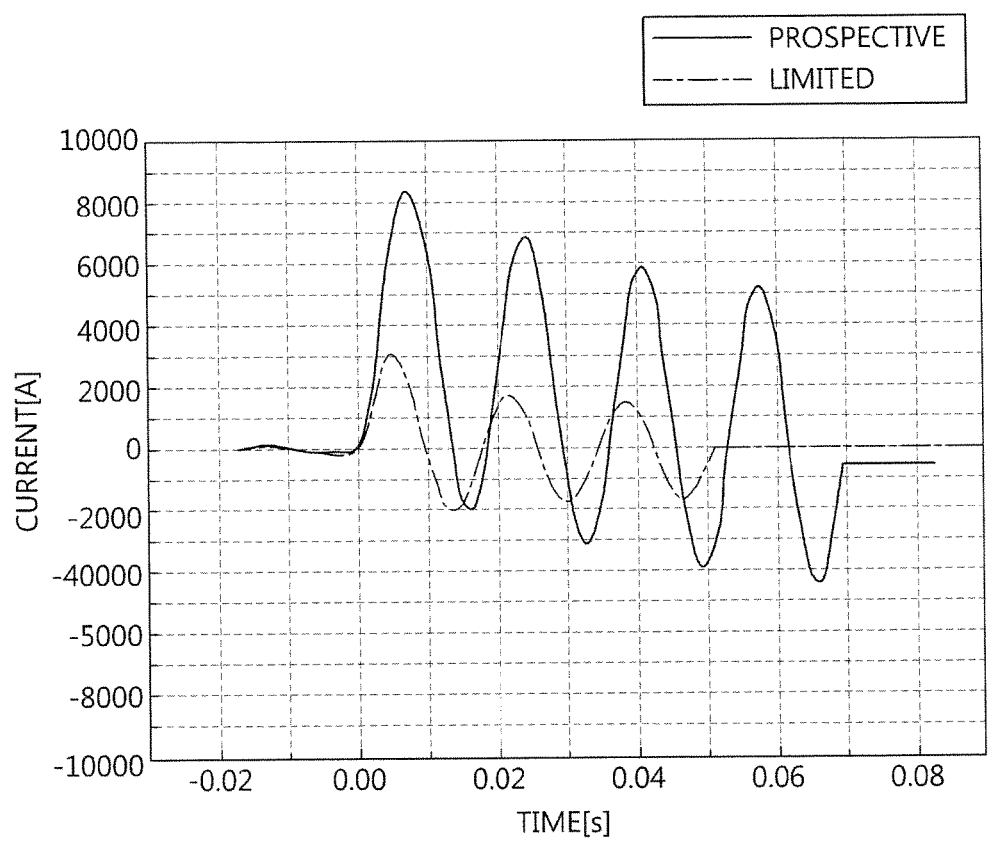
FIG. 19 illustrates the short-circuit characteristics of fault current in the current-limiting element according to the present invention.
Figure 20:
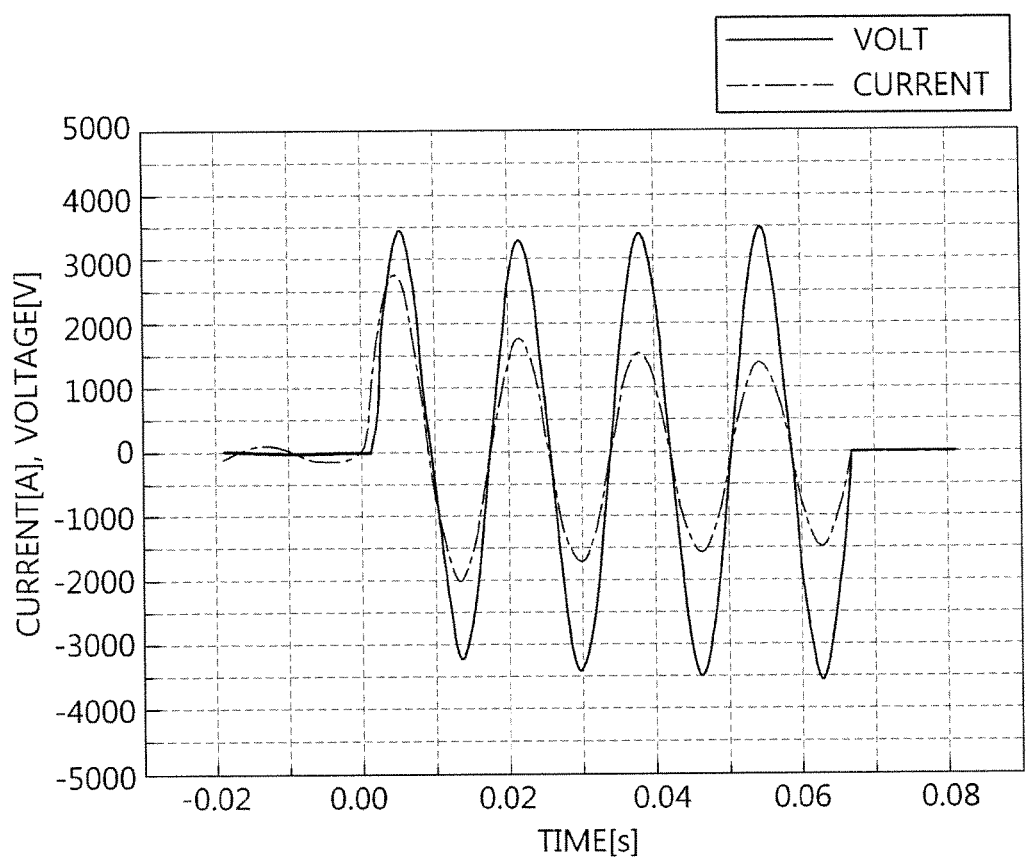
FIG. 20 illustrates changes in voltage over time in FIG. 19.

FIG. 19 illustrates the short-circuit characteristics of fault current in the current-limiting element according to the present invention, and FIG. 20 illustrates changes in voltage over time in FIG. 19.

FIGS. 19 and 20 show the results of testing for limiting fault current, which is regarded as important in the superconducting current-limiting element. When normal current is conducted, the voltage is zero due to the absence of an impedance component.

In FIG. 19, 'prospective' represents the waveform of fault current in the absence of a current-limiting element. If the inductance component is typically provided in the circuit, an asymmetrical current waveform is observed.

Also, 'limited' represents a graph for limiting the fault current in the presence of the current-limiting element. When the fault current is limited in this way by the current-limiting element according to the present invention, symmetrical current is generated. The fault current is conducted from the time of 0.00, and thus, when the magnitude of fault current exceeds the critical current of the superconducting wires 100, short-circuit current is limited while causing the phase transition of the superconducting wires 100.

As described hereinbefore, the current-limiting element according to the present invention is configured such that bar-shaped superconducting elements are stacked, thus facilitating the expansion of the current-limiting element in series. Also, a plurality of superconducting wires 100 is disposed at the connection block 200 and the insulation block 300 in the same layer, thus facilitating the expansion of the current-limiting element in parallel.

Also, since the superconducting wires 100 of the current-limiting element are bar-shaped, there is no need for an additional winding machine, and turn-to-turn voltage can be maintained constant upon expansion of the current-limiting element in series, thereby obviating additional insulation.

Also, as the thicknesses of the connection blocks 200 and the insulation blocks 300 are increased or decreased, it is easy to control the gaps between the stacked superconducting wires 100, thus making it possible to realize an appropriate design in consideration of which factor, among the cooling performance and the loss of alternating current flowing in opposite directions in the superconducting wires 100 in individual layers, is deemed important.

Although the preferred embodiments of the present invention have been disclosed for illustrative purposes, those skilled in the art will appreciate that the technical ideas of the present invention are not limited to the appended drawings and the above description, and also that various modifications are possible, without departing from the scope and spirit of the invention as disclosed in the accompanying claims. Such modifications may be incorporated in the claims of the present invention within the range that falls within the spirit of the present invention.

What is claimed is:

1. A superconducting current-limiting element for a current limiter, comprising:
   superconducting wires extending in a straight line and stacked in one or more layers;

connection blocks and insulation blocks respectively disposed at both ends of the superconducting wires between the stacked superconducting wires so that the connection blocks and the insulation blocks are alternately located in each of the layers; and a terminal provided at each of an end of an uppermost superconducting wire and an end of a lowermost superconducting wire among the stacked superconducting wires, wherein the superconducting wires are in a bar shape configured to include a substrate extending in a straight line on one surface thereof and a superconductor provided on another surface thereof.

2. The superconducting current-limiting element of claim 1, wherein each of the connection blocks includes seating recesses, which are formed in both surfaces thereof coming into contact with the superconducting wires and into which both ends of the superconducting wires are seated.

3. The superconducting current-limiting element of claim 2, wherein each of the connection blocks includes:

first mounting recesses formed to a shallower depth than the seating recesses so as to form a stepped portion along a circumference of each of the seating recesses; and connection caps mounted into the first mounting recesses to cover the superconducting wires seated into the seating recesses.

4. The superconducting current-limiting element of claim 3, wherein each of the insulation blocks includes second mounting recesses, which are formed in both surfaces thereof and into which the connection blocks, disposed on and under any one of the insulation blocks, are seated.

5. The superconducting current-limiting element of claim 3, wherein solders are provided between a first surface of the end of the superconducting wire seated into each of the seating recesses and the seating recess and between a second surface of the end of the superconducting wire, opposite the first surface, and the connection cap, so that the superconducting wires and the connection blocks are bonded together.

6. The superconducting current-limiting element of claim 5, wherein the solders have a processing temperature of less than 100° C. but exceeding 0° C.

7. The superconducting current-limiting element of claim 1, further comprising:

a pair of clamps provided at both sides of each of the uppermost superconducting wire and the lowermost superconducting wire among the stacked superconducting wires; and a support bar having both ends joined to the pair of clamps.

8. The superconducting current-limiting element of claim 7, wherein both ends of the support bar, which are passed through the pair of clamps and protrude from the clamps, are provided with an elastic member for elastically supporting the pair of clamps such that the clamps come into close contact with each other.

9. The superconducting current-limiting element of claim 1, wherein the stacked superconducting wires are connected in parallel so that one or more superconducting wires come into contact with the same connection block and insulation block in each of the layers.

10. The superconducting current-limiting element of claim 1, further comprising:

a pair of holders, which are formed to extend in a height direction of the stacked superconducting wires, include through-holes formed at predetermined intervals along an extension direction, and are disposed at both sides of the stacked superconducting wires; and spacers, both ends of which are fitted into the through-holes and supported by the pair of holders.

11. The superconducting current-limiting element of claim 8, wherein each of the holders includes a groove, which is formed in a direction of extension of the holders and in which the through-holes are formed, and the groove is filled with an adhesive.

12. The superconducting current-limiting element of claim 7, wherein the clamps and the support bar are removed from the superconducting wires after bonding of the superconducting wires and the connection blocks using the solders provided between the first surface of the end of the superconducting wire seated into each of the seating recesses and the seating recess and between the second surface of the end of the superconducting wire, opposite the first surface, and the connection cap.

* * * * *